United States Patent
Woo

(10) Patent No.: US 9,209,478 B2
(45) Date of Patent: Dec. 8, 2015

(54) ELONGATED MANDREL FOR A WINDING DEVICE

(75) Inventor: Soonki Woo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1683 days.

(21) Appl. No.: 11/646,378

(22) Filed: Dec. 28, 2006

(65) Prior Publication Data

US 2007/0180686 A1   Aug. 9, 2007

(30) Foreign Application Priority Data

Dec. 29, 2005  (KR) .................. 10-2005-0134527

(51) Int. Cl.
*H01M 4/13*    (2010.01)
*H01M 10/04*   (2006.01)
(Continued)

(52) U.S. Cl.
CPC ......... *H01M 10/0431* (2013.01); *H01F 27/306* (2013.01); *H01F 41/122* (2013.01); *H01M 4/13* (2013.01); *H01M 4/139* (2013.01); *H01M 6/10* (2013.01); *H01M 10/0525* (2013.01); *H01M 10/0587* (2013.01); *H03H 7/0115* (2013.01); *H01F 41/0604* (2013.01); *H01F 41/0658* (2013.01); *H01M 2/022* (2013.01); *H03H 1/0007* (2013.01); *Y02E 60/122* (2013.01); *Y10T 29/4902* (2015.01); *Y10T 29/49071* (2015.01);
(Continued)

(58) Field of Classification Search
CPC ......... H01M 4/13; H01M 4/139; H01M 6/10; H01M 10/0431; H01M 10/0525; H01M 10/0587; H01M 2/022; Y02E 60/122; H01F 27/306; H01F 41/0604; H01F 41/0658; H01F 41/122; H03H 7/0115; H03H 1/0007; Y10T 29/53217; Y10T 29/4902; Y10T 29/49071; Y10T 29/49073; Y10T 29/49108; Y10T 29/53991; Y10T 29/53243
USPC ............... 29/283, 605, 602.1, 606, 749, 755; 336/192, 208, 221; 429/94; 242/532.6, 242/587
See application file for complete search history.

(56) References Cited

U.S. PATENT DOCUMENTS 2,462,191 A * 2/1949 Hodnette et al. ............ 29/605 X
5,528,205 A * 6/1996 Wong ........................ 336/221 X
(Continued)

FOREIGN PATENT DOCUMENTS

JP   60059667 A * 4/1985 .................. 429/94
JP   04017313 A * 1/1992 .................. 29/605 X
(Continued)

OTHER PUBLICATIONS

KIPO Notice of Allowance dated May 28, 2007, for Korean priority Patent application 10-2005-0134527.
English translation of JP 36-011899 corresponding to Japanese Publication 09-035738.
English translation of Japanese Publication 11-111328.
English translation of Japanese Publication 2004-335380.

*Primary Examiner* — A. Dexter Tugbang
(74) *Attorney, Agent, or Firm* — Christie, Parker & Hale, LLP

(57) ABSTRACT

An electrode plate winding device and rolling method for cylinder type battery that is to increase a battery capacity by rolling the electrode plate in a cylinder-like shape. The electrode plate winding device has a mandrel which winds electrode plates coated with the active material layers having different polarity and separators, interposed between the plates. The mandrel is of a generally round cross-section but divided into two parts by a groove. The mandrel having at least one electrode tap region formed in one of the divided parts.

19 Claims, 2 Drawing Sheets

FIG 3

(51) Int. Cl.
    *H01M 4/139*     (2010.01)
    *H01F 41/12*     (2006.01)
    *H03H 7/01*     (2006.01)
    *H01F 27/30*     (2006.01)
    *H01M 6/10*     (2006.01)
    *H01M 10/0525*     (2010.01)
    *H01M 10/0587*     (2010.01)
    *H01F 41/06*     (2006.01)
    *H03H 1/00*     (2006.01)
    *H01M 2/02*     (2006.01)

(52) U.S. Cl.
    CPC ...... *Y10T 29/49073* (2015.01); *Y10T 29/49108* (2015.01); *Y10T 29/53217* (2015.01); *Y10T 29/53243* (2015.01); *Y10T 29/53991* (2015.01)

(56) References Cited

U.S. PATENT DOCUMENTS

| | | | | |
|---|---|---|---|---|
| 6,121,696 A | * | 9/2000 | Chen | 336/221 X |
| 6,344,787 B1 | * | 2/2002 | McGrane et al. | 336/208 X |

FOREIGN PATENT DOCUMENTS

| | | |
|---|---|---|
| JP | 09-035738 | 2/1997 |
| JP | 11-111328 | 4/1999 |
| JP | 11-288733 | 10/1999 |
| JP | 2001-202986 | 7/2001 |
| JP | 2003-151538 | 5/2003 |
| JP | 2004-335380 | 11/2004 |
| KR | 20-0215592 Y1 | 3/2001 |

\* cited by examiner

ELONGATED MANDREL FOR A WINDING DEVICE

CROSS-REFERENCE TO RELATED APPLICATIONS

This application claims priority to and the benefit of Korean Patent Application No. 2005-134527, filed on Dec. 29, 2005, the entire content of which is incorporated herein by reference.

BACKGROUND OF THE INVENTION

1. Field of the Invention

Aspects of the present invention relate to an electrode plate winding device and rolling method for a cylinder type battery and, more particularly, to an electrode plate winding device and rolling method for cylinder type battery that is to increase the capacity of a battery by rolling the electrode plate in a cylinder-like shape.

2. Description of the Related Art

In general, batteries are divided into primary and secondary batteries. Secondary batteries are rechargeable while primary batteries are not. Secondary batteries are able to charge and discharge and are widely used in the field of cutting-edge electronics such as cellular phones, notebook computers, and camcorders, etc. In particular, a lithium secondary battery is increasingly used since it has high energy density per unit weight and has an operating voltage of 3.6V, which is 3 times the operating voltage of a nickel-cadmium battery or a nickel-metal hydride battery.

The lithium secondary battery uses a lithium based oxide as a cathode active material and a carbon material as an anode active material. In addition, the lithium battery can be made of various shapes, such as cylindrical, rectangular, and pouch-type.

Among them, a cylinder type secondary battery is composed of an electrode assembly, a cylindrical can, which houses the electrode assembly and an electrolytic solution, and a cap assembly that seals the cylindrical can and provides for safety checks in case of high temperatures or pressures. The electrode assembly is generally electrically connected to the cylindrical can and the cap assembly.

The electrode assembly is simply a stack of plates rolled into a cylinder. Here, two rectangular-shaped plate electrodes with a separator arranged between the two electrodes, which prevents a short-circuit between two electrodes, are stacked, laminated, and rolled into a cylinder; and thus, a jelly-roll-type electrode assembly is made.

Each individual electrode plate is attained by applying an active material slurry to a current collector composed of a metallic foil. For example, the positive electrode collector, often a thin aluminum foil, will be coated with a positive electrode active material. However, each electrode generally contains two uncoated parts: one uncoated part on a first-end and one uncoated part on a back-end of each current collector. The first-end of each electrode is located at the outer circumference of the resultant cylindrical electrode assembly and the back-end of each electrode plate is located in the center of the resultant cylindrical electrode assembly. An electrode tap is connected to each electrode plate at one of the uncoated parts. The electrode taps electrically connect one electrode plate to the cylindrical can and the other electrode plate to the cap assembly. The electrode assembly is insulated by the cylindrical can so that the current may only travel through the electrode taps resulting in a cell that is able to be easily inserted into a circuit for charging or discharging. In general, one of the electrode taps is drawn upward from the electrode assembly in the direction of the cap assembly, and the other electrode tap is drawn downward from the electrode assembly to the bottom of the cylindrical can.

In order to form this cylindrical electrode assembly, the positive electrode plate, separator, and negative electrode plate are rolled with a mandrel. The conventional structure of the mandrel of the electrode plate winding device and rolling method are as follows:

The mandrel, which winds the electrode assembly cylindrically, has a generally round cross-section, but is divided into two parts by means of the groove. The back-end of the laminated stack of the positive electrode plate, the separator, the negative electrode plate, and another separator is inserted and fixed into the groove of the mandrel.

Then, the mandrel is rotated. The laminated electrode plates and separators are wound around the outer surface of the mandrel with the uncoated first-end of the stack at the outer circumference of the resultant cylindrical electrode assembly. The electrode assembly is completed by fixing a tape about the outer circumference of the electrode assembly so that the electrode assembly does not unwind.

However, the conventional structure of the mandrel for the electrode plate winding device has the following disadvantages:

In the cylindrical electrode assembly, one of the two electrode taps, which are connected to the uncoated part of the electrode plates, is drawn from the central core inside the electrode assembly. For example, when the number of turns is 18, the uncoated part in which the electrode tap is connected is wound at a first or a second turn.

There is a lower limit for reducing the thickness and width of the electrode taps as each electrode tap requires a certain level of strength and conductivity. The electrode taps are generally of a thickness of about 0.3-0.5 mm. Considering that the thickness of each electrode plate is generally about 150 μm and the thickness of each separator is generally about 20 μm, the thickness of the electrode tap is relatively much thicker.

Because the uncoated part to which an electrode tap, which is of a relatively great thickness and a rectangular plate-shape, is connected is wound around the outer surface of the mandrel at the early stage, the portion of the electrode assembly to which the electrode tap connects has the greater curvature than electrode plate at the same turn number within the electrode assembly. That is, the portion of the electrode plate at which the electrode tap connects in turn 2 of the electrode assembly will have more curvature than another portion of the electrode plate in turn 2 of the same electrode assembly where the electrode tap does not attach resulting in an electrode assembly that is not cylindrically wound. The external shape of the electrode assembly will not have a cylindrical shape because of the placement of the electrical tap.

Because of the noncylindrical resultant shape of the electrode assembly, the battery capacity per volume is reduced as the number of turns achievable in the same volume is fewer. Furthermore, with the noncylindrical electrode assembly the insertion of the electrode assembly into the cylindrical can is more difficult and requires more volume.

SUMMARY OF THE INVENTION

Accordingly, it is an aspect of the present invention to overcome the problems associated with the related art and/or other problems. Another aspect of the present invention is to increase the battery capacity by winding the electrode plates cylindrically and thus by increasing the number of turns.

An electrode plate winding device according to an embodiment of the invention comprises a mandrel to wind a first and a second electrode plate, a first and a second separator, and a fixing tape, and to apply at least one electrode tap. The electrode plate winding device further comprises a first, a second, a third, and a fourth supply apparatus, and a fixing tape supply apparatus; and a cutter. The mandrel comprises a generally round cross-section with at least two divided parts and a groove to divide the mandrel into the at least two divided parts. Furthermore, the mandrel comprises at least one electrode tap region on the external surface of at least one of the divided parts. The first electrode plate and the second electrode plate are each coated with an active material layer, and the separators are interposed between the first and the second electrode plates.

An electrode tap region on one of the divided parts is formed at the location where the electrode taps are to connect to the first and second electrode plates. And, the electrode tap region may be of rectangular shape as seen from the transverse direction, or when viewed at a right angle to the central axis of the cylindrical mandrel. The width of the electrode tap region is generally greater than the width of the electrode taps to be connected.

The method of rolling the electrode plate according to a further embodiment of the invention comprises the following operations of forming the first and second electrode plates by applying the active polar material; stacking the first and second electrode plates with the first and second separators, and then winding the electrode plates about the mandrel of the winding device; and connecting the electrode taps to the first and second electrode plates at the electrode tap region of the mandrel.

Another aspect of the present invention is to increase the battery capacity by increasing the number of turns achievable in the same volume by winding the electrode plates more cylindrically. Accordingly, aspects of the present invention, as well as others, overcome the above-described problems associated with the related art.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
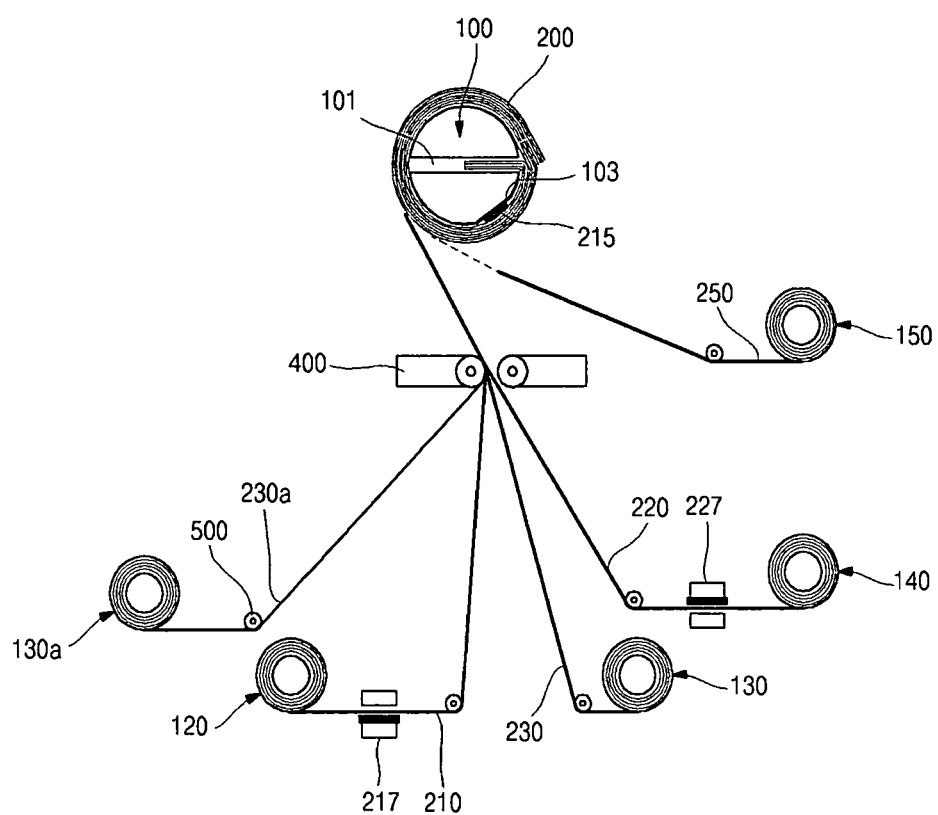
FIG. 1 is a schematic view of an electrode plate winding device exhibiting aspects of the present invention.

Reference will now be made in detail to aspects of the embodiments of the present invention, examples of which are illustrated in the accompanying drawings, wherein like reference numerals refer to the like elements throughout. The embodiments are described below in order to explain the present invention by referring to the figures.

Hereinafter, aspects of the present invention will now be described in detail with reference to the accompanying drawings.

FIG. 1 is a schematic view of an electrode plate winding device according to an embodiment of the present invention. Referring to FIG. 1, the electrode plate winding device comprises a first supply apparatus 120 which supplies a first electrode plate 210; a second supply apparatus 130 which supplies a first separator 230; a third supply apparatus 130a which supply apparatus 130 which supplies a first separator 230; a third supply apparatus 130a which supplies a second separator 230a; and a fourth supply apparatus 140 which supplies a second electrode plate 220. The electrode plate winding device further comprises a cutter 400, which cuts to a specific length the first and second electrode plates 210 and 220, respectively, and the first and second separators 230 and 230a, respectively. The electrode plate winding device further comprises a mandrel 100, about which the first and second electrode plates 210 and 220, respectively, and the first and second separators 230a and 230, respectively, are wound. Finally, the feed rollers 500 guide and feed the first and second electrode plates 210 and 220, respectively, and the first and second separators 230a and 230, respectively, to the mandrel 100.

The first, the second, the third, and the fourth supply apparatuses 120, 130, 130a, and 140, respectively, comprise the first supply apparatus 120 about which the first electrode plate 210 is wound, the second supply apparatus 130 about which the first separator 230 is wound, and the third supply apparatus 130a about which the second separator 230 is wound, and the fourth supply apparatus 140 about which the second electrode plate 220 is wound. In this case, the respective supply apparatuses 120,130, 130a, and 140 are arranged such that when the electrode plates 210 and 220 and the separators 230 and 230a form a stack to be wound about the mandrel 100, the electrode plates 210 and 220 are separated from each other by the separators 230 and 230a. Or, the formation of the stack to be wound about the mandrel 100 to form the electrode 200 is formed such that the second electrode plate 220 is closest to the mandrel 100, followed by the first separator 230, the first electrode plate 210, and finally the second separator 230a being located furthest away from the mandrel 100. The second separator 230a is located such that on the second winding resulting in the second layer of the electrode assembly 200 the second separator 230a is separating the first electrode plate 210 from the second electrode plate 220.

The first electrode tap 215 is attached to the first electrode plate 210 at the uncoated part of the first electrode plate 210 at the first electrode tap attachment region 217. The second electrode tap (not shown) is attached to the second electrode plate 220 at the uncoated part of the second electrode plate 210 at the second electrode tap attachment region 227.

The cutter 400 cuts to a specific length the first and second electrode plates 210 and 220 and the first and second separators 230 and 230a drawn from each respective supply apparatus 120, 140, 130, and 130a. That is, the cutter 400 cuts the respective electrode plates 210 and 220 and separators 230 and 230a to length so as to form an electrode assembly.

The mandrel 100 is rotated by a drive unit (not shown) which winds the first and second electrode plates 210 and 220 and the first and second separators 230 and 230a simultaneously in a specific stack sequence. The specific stack sequence with respect to the aspects of this embodiment is that the second electrode plate 220 is closest to the mandrel 100, followed by the first separator 230, the first electrode plate 210, and finally the second separator 230a—located furthest away from the mandrel 100. FIG. 1 shows that the second electrode plate 220, the separator 230, the first electrode plate 210, and the separator 230a are wound in such sequence.

The feed rollers 500 are rotated about rotational axes by drive units (not shown). The feed rollers 500 guide and feed the first and second electrode plates 210 and 220 and the first and second separators 230 and 230a each drawn from the respective supply apparatuses 120, 140, 130, and 130a. The fixing tape 250 drawn from the fixing tape supply apparatus 150 is guided by an individual feed roller 500 but supplied directly to the electrode assembly 200 only when the electrode assembly 200 has been sufficiently wound about the mandrel 100 to form a finished electrode assembly 200. The supplying of the fixing tape 250 to the electrode assembly 200 completes the electrode assembly 200. Once the first and second electrode plates 210 and 220 and the separators 230 and 230a are wound about the mandrel 100, the fixing tape 250 is attached to the external surface of the first and second electrode plates 210 and 220 and the separators 230 and 230a, and thus the electrode assembly is complete.

Figure 2:
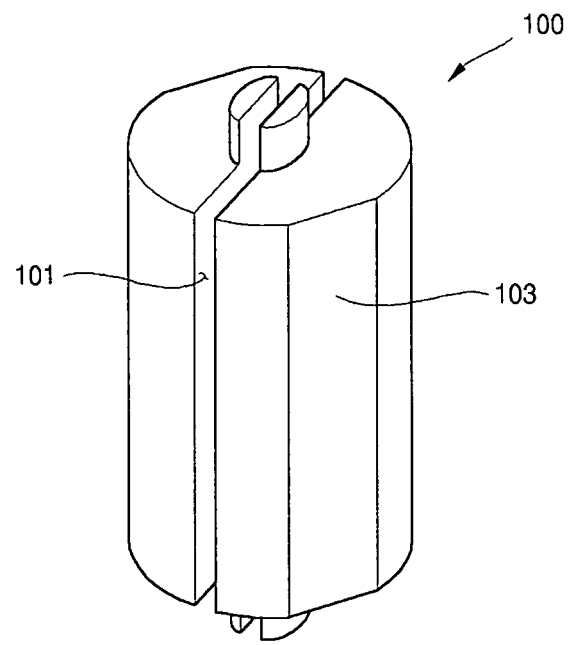
FIG. 2 is a schematic perspective view of the mandrel of the electrode plate winding device exhibiting aspects of the present invention.
Figure 3:
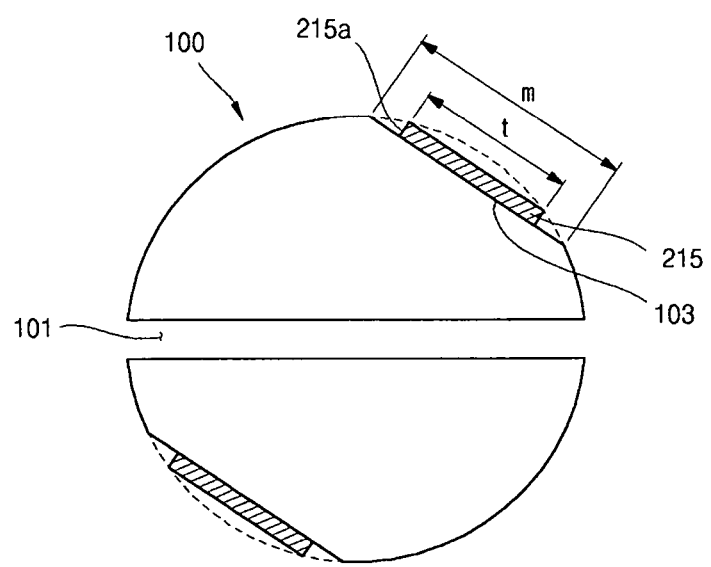
FIG. 3 is a cross-sectional view of the mandrel from FIG. 2.

The construction of the mandrel is as follows:

FIG. 2 is a perspective view of the mandrel of the electrode plate winding device illustrating an aspect of the present invention, and FIG. 3 is a cross-sectional view of the mandrel from FIG. 2.

Referring to FIGS. 2 and 3, the mandrel 100 comprises a generally round cross-section with at least two divided parts and a groove 101 that divides the mandrel into the at least two divided parts. Furthermore, the mandrel comprises at least one electrode tap region 103 on the external surface of at least one of the divided parts.

The mandrel 100 is cylindrically shaped as a whole and is of generally round cross-section so as to manufacture a cylinder type battery.

The mandrel 100 is divided into the two divided parts by the groove 101, in which the ends of the first and second electrode plates and the first and second separators are inserted. Another aspect of the mandrel (not shown) could comprise an electrode stop to fix the ends of the first and second electrode plates and the first and second separators to an inner surface of the mandrel to hold the ends while the mandrel is rotated.

To drive the mandrel 100, a support (not shown) is connected to at least one of the two divided parts. A driving unit (not shown) is connected to the support to turn or rotate the mandrel 100 about a central axis of the mandrel 100 to wind of the first and second electrode plates and the first and second separators into an electrode assembly.

The support may be of various shapes; for example, protrusions may be formed on an upper part and a lower part of the mandrel and a supporting recess into which the protrusions are inserted may be formed in the support such that the protrusions and the supporting recess can be connected. Alternatively, the mandrel and the support may be integrated and an electrode stop can be formed on inner surface of the mandrel so as to fix the end of the first and second electrode plates and the first and second separators.

Furthermore, the electrode tap region 103 in the outer surface of the mandrel 100 is formed where the electrode taps are connected to the first and second electrode plates. An electrode tap region 103, as shown in FIG. 3, can be formed in each of the two divided parts. Other aspects of this invention that can be clearly seen include forming only one electrode tap region 103 in the outer surface of the mandrel 100 or forming two electrode tap regions in one of the two divided parts of the mandrel 100. Also, the electrode tap region 103 may only extend partially down the length of the cylindrical mandrel 100. Moreover, the electrode tap region 103 may be formed so as to hold or cradle the electrode tap 215 wherein the electrode tap 215 remains connectable to the electrode plate. Another aspect of the mandrel may include rounding the edge of the groove 101 so that the first and second electrode plates and the first and second separators, upon exit of the groove 101, do not affect the final cylindrical shape of the electrode assembly.

However, the placement of the electrode tap regions 103 depends upon the position at which the first and second electrode taps are connected to the first and second electrode plates. For example, if the first electrode tap is drawn from the core, inside the center of the electrode assembly, and the second electrode tap is drawn from the outer circumference of the electrode assembly, then only one electrode tap region 103 in one of the two divided parts in the surface of the mandrel 100 is necessary; the electrode tap region 103 would be formed at the location needed for connecting the second electrode tap from the electrode assembly.

The electrode tap region 103, as shown in FIGS. 2 and 3, may be rectangular shaped as seen from the transverse direction with respect to the central axis of the cylindrical mandrel. The shape of the electrode tap region 103 is dependent upon the shape of the electrode taps.

With reference to FIG. 3, the width (m) of the electrode tap region 103 is greater than or equal to the width (t) of the electrode tap 215.

More specifically in FIG. 3, the width (m) of the electrode tap region 103 is a chord of the outer diameter of the mandrel 100 that is dependent upon the thickness 215a and the width (t) of the electrode tap 215. The chord of the outer diameter of the mandrel 100 is a straight line that connects to individual points on the diameter of the mandrel 100. The electrode tap region 103 is formed deep enough with respect to the thickness 215a and the width (t) of the electrode tap 215 such that the inner surface (with respect to the center of the mandrel 100) of the electrode tap 215 contacts the electrode tap region 103 and the outer surface of the electrode tap 215 makes contact with an imaginary outer surface (a dotted line in FIG. 3) so that the width (t) at a distance equal to the thickness 215a from the electrode tap region 103 is a chord of the outer diameter of the mandrel 100, as represented by the imaginary outer surface of the mandrel 100 and dotted line in FIG. 3. The curvature of the imaginary outer surface corresponds to the curvature of the outer diameter of the mandrel 100. The electrode tap region 103 results in the uncoated part of one of the electrode plates to which the electrode tap 215 is connected being more cylindrically shaped and ultimately provides for a rounder, more truly cylindrically-shaped electrode assembly. Therefore, the number of turns can be increased with respect to the volume of the electrode assembly, and thus the battery capacity can be increased with respect to the volume of the electrode assembly.

Furthermore, the width of the electrode tap region 103 is wider than the width (t) of the electrode tap 215 so that as the electrode plates and separators are wound about the outer diameter of the mandrel 100, the mandrel 100 and the electrode tap 215 present a smoother, more even face resulting in a more cylindrical electrode assembly. The length of the electrode tap region 103 along the central axis of the mandrel 100 is longer than the width of the electrode plates and the separators. The electrode tap region 103 of the mandrel 100 needs to be of sufficient size to properly seat the electrode tap 215 so that the resultant electrode assembly is more cylindrical.

The groove 101 is formed in the core of the mandrel 100 and accepts the ends of the electrode plates and the separators, holding the ends of the electrode plates and the separators fixed while the mandrel 100 rotates and forms the electrode assembly. The edges of groove 101 may be rounded so that, upon exit of the groove 101, the first and second electrode plates and the first and second separators do not deform the cylindrical shape of the finished electrode assembly.

In addition, the two divided parts are formed at a specific distance so that the two divided parts at that specific distance provide a more circular cross section resulting in a more cylindrical mandrel 100 and a more cylindrical electrode assembly. If the two divided parts are misaligned, the resultant electrode assembly is less cylindrical.

The method of winding the electrode plates and the separators to form the electrode assembly of the cylinder type battery is as follows:

First, the first and second electrode plates and the first and second separators are prepared. The first electrode plate may act as the cathode and is formed by applying the first active material layer to one or both faces of the cathode current collector. The cathode current collector is made of a highly conductive metallic foil, for example an aluminum foil. As the active material, lithium compounds such as $LiCoO_2$, $LiMn_2O_4$, $LiNiO_2$, $LiNi_{1-x}Co_xO_2$ ($0<x<1$) and $LiMnO_2$ are used; however, the embodiments of the current invention are not limited to these materials.

The second electrode plate may act as the anode and is formed by applying the second active material layer to one or both faces of the anode current collector. The anode current collector is made of conductive metallic foil, for example Cu or Ni foil. As the active material, carbon-based materials such as Si, Sn, tin oxide, a composite tin alloy, a transition metal oxide, and lithium metal nitride or oxide are used; however, the embodiments of the current invention are not limited to these materials.

The first and second separators are to prevent a short-circuit between the first electrode plate and the second electrode plate, and allow a secondary battery to charge. For example, the separators in a lithium ion secondary battery allow the secondary battery to recharge after the secondary battery has discharged. The separators are of the group comprising polyethylene, polypropylene, and a co-polymer of polyethylene and polypropylene; however, the embodiments of the current invention are not limited to these materials.

Subsequently, the prepared first and second electrode plates and the first and second separators are stacked in a sequence and laminated. For example, the sequence of stacking from the center of the mandrel to the outer diameter of the electrode assembly, as described above, is the second electrode plate, the first separator, the first electrode plate, and then the second separator. The end of the laminated stack is inserted into, and may be fixed in, the groove. The laminated stack is then wound by the electrode plate winding device about the mandrel such that the electrode taps arranged in the electrode tap region are connected to the uncoated parts of the first and second electrode plates.

Then, the fixing tape is attached to the external surface of the first and second electrode plates and the first and second separators so that the electrode assembly does not unwind.

Therefore, according to aspects of the present invention, the electrode plates and the separators can be rolled cylindrically by positioning the electrode taps in the electrode tap regions; and thus, the number of turns per volume and the battery capacity per volume are increased and the electrode assembly is more easily placed in a cylindrical can.

Another aspect of the current invention is to provide a mandrel with electrode tap regions to an electrode plate winding device that forms truer cylindrically shaped electrode assemblies to more efficiently utilize the volume of the cylindrical cans. In turn, such efficient use of the volume of the cylindrical cans results in a more powerful battery per volume.

From the foregoing, one skilled in the art will observe that numerous variations and modifications may be effected without departing from the spirit and scope of the novel concept of the invention. It is to be understood that no limitation with respect to the specific embodiments illustrated herein is intended or should be inferred. It is, of course, intended to cover by the appended claims all such modifications as fall within the scope of the claims.

What is claimed is:

1. A generally cylindrical, elongated mandrel, comprising:
    a first divided part having a generally semicircular cross-sectional shape comprising a generally curved region and a generally straight region;
    a second divided part having a generally semicircular cross-sectional shape comprising a generally curved region and a generally straight region, the first and second divided parts being arranged such that the generally straight region of the first divided part faces the generally straight region of the second divided part such that the first and second divided parts together have a generally cylindrical shape defined by the generally curved region of the first divided part and the generally curved region of the second divided part as an exterior of the generally cylindrical shape;
    a first electrode tap region of the first divided part, the first electrode tap region comprising a generally flat region in the generally curved region of the first divided part at the exterior of the generally cylindrical shape, wherein the first divided part and the first electrode tap region define a first cross-sectional shape of the first divided part;
    a second electrode tap region of the second divided part, the second electrode tap region comprising a generally flat region in the generally curved region of the second divided part at the exterior of the generally cylindrical shape, wherein the second divided part and the second electrode tap region define a second cross-sectional shape of the second divided part, the first cross-sectional shape of the first divided part and the second cross-sectional shape of the second divided part are generally the same, and the first electrode tap region and the second electrode tap region are diametrically opposed across the generally cylindrical shape of the mandrel; and
    a groove extending between the first and second divided parts, the groove being configured to receive an end of a material to be wound by the mandrel, and the first and second divided parts and the groove together being configured to wind the material around the exterior of the generally cylindrical shape around the first and second divided parts such that the material to be wound by the mandrel is wound across the first and second electrode tap regions.

2. The mandrel of claim 1, wherein each of the first and second electrode tap regions comprises a rectangularly shaped area when viewed from a transverse direction.

3. The mandrel of claim 2, wherein each of the first and second electrode tap regions comprises a rectangularly shaped area that extends an entire length along a central axis of the mandrel when viewed from the transverse direction.

4. The mandrel of claim 2, wherein each of the first and second electrode tap regions comprises a depth with respect to the center of the mandrel sufficient to form a chord on an outer circumference of the generally cylindrical shape.

5. The mandrel of claim 1, wherein the groove comprises rounded edges such that a stack of plates wound around the mandrel and having an edge inserted into the groove has a substantially cylindrical shape.

6. The mandrel of claim 1, wherein the groove comprises a space between the first divided part and the second divided part, wherein the space is sufficiently large such that the mandrel is generally cylindrical.

7. The mandrel of claim 1, wherein the first and second electrode tap regions are configured to minimize deformation of a resultant wound stack of plates wound about the mandrel and to increase the turns per volume of the resultant wound stack of plates.

8. The mandrel of claim 1, wherein each of the first and second electrode tap regions is configured to fit an electrode tap and the electrode tap is connectable to an electrode plate.

9. The mandrel of claim 1, wherein the first and second electrode tap regions are each defined by a chord of an outer diameter of the mandrel.

10. The mandrel of claim 1, wherein the first and second electrode tap regions are each configured to allow connection of an electrode tap to an electrode plate wound around the mandrel and to minimize deformations in a resultant cylindrical shape of the electrode wound around the mandrel.

11. An electrode plate winding device for a cylinder type battery comprising:
the mandrel of claim 1 for winding the material, the material comprising a first electrode plate to which a first active material layer is applied and a second electrode plate to which a second active material layer is applied;
the first active material layer and the second active material layer each having a different polarity;
a first separator arranged between the first electrode plate and the second electrode plate;
a second separator arranged so that, upon winding of the first electrode plate, the second electrode plate, the first separator, and the second separator about the mandrel, the second separator is between the second electrode plate and the first electrode plate.

12. The electrode plate winding device according to claim 11, wherein each of the first and second electrode tap regions forms an area wherein an electrode tap is connected to the first electrode plate or the second electrode plate.

13. The electrode plate winding device according to claim 12, wherein the width of each of the first and second electrode tap regions is greater than or equal to the width of the electrode tap.

14. The electrode plate winding device according to claim 13, wherein a depth of each of the first and second electrode tap regions allows for an outer surface, with respect to the center of the mandrel, of the electrode tap to form a chord on an outer diameter of the mandrel.

15. The electrode plate winding device according to claim 11, wherein the first and second electrode tap regions are rectangularly shaped as seen from a transverse direction.

16. The electrode plate winding device according to claim 15, wherein a length of each of the first and second electrode tap regions is longer than that of an area to be covered with the first or second electrode plate.

17. The electrode plate winding device according to claim 11, wherein the groove is formed in the generally cylindrical shape of the mandrel.

18. The electrode plate winding device according to claim 11, wherein the first and second divided parts are arranged so that the first and second divided parts are matched at a specific distance.

19. The electrode plate winding device according to claim 18, wherein the specific distance at which the first and second divided parts are matched provides for the generally cylindrical shape.

* * * * *